United States Patent
Shih et al.

(10) Patent No.: US 11,187,997 B2
(45) Date of Patent: *Nov. 30, 2021

(54) PHOTOLITHOGRAPHY APPARATUS AND METHOD FOR HANDLING WAFER

(71) Applicant: TAIWAN SEMICONDUCTOR MANUFACTURING CO., LTD., Hsinchu (TW)

(72) Inventors: Po-Ming Shih, Changhua County (TW); Chi-Hung Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/013,267

(22) Filed: Sep. 4, 2020

(65) Prior Publication Data
US 2020/0401049 A1    Dec. 24, 2020

Related U.S. Application Data

(63) Continuation of application No. 16/232,952, filed on Dec. 26, 2018, now Pat. No. 10,768,534.

(60) Provisional application No. 62/718,958, filed on Aug. 14, 2018.

(51) Int. Cl.
G03F 7/20       (2006.01)
H01L 21/027     (2006.01)
H01L 21/687     (2006.01)

(52) U.S. Cl.
CPC .......... *G03F 7/707* (2013.01); *G03F 7/70741* (2013.01); *H01L 21/027* (2013.01); *H01L 21/68757* (2013.01)

(58) Field of Classification Search
CPC .... G03F 7/707; G03F 7/70741; G03F 7/7095; H01L 21/027; H01L 21/68757; H01L 21/67742; H01L 21/68707; H01L 21/6875
See application file for complete search history.

(56) References Cited

U.S. PATENT DOCUMENTS

| | | |
|---|---|---|
| 5,563,684 A | 10/1996 | Stagaman |
| 2002/0008864 A1 | 1/2002 | Kondo |
| 2005/0238922 A1 | 10/2005 | Kinoshita et al. |
| 2006/0018018 A1 | 1/2006 | Nomura et al. |

(Continued)

FOREIGN PATENT DOCUMENTS

| | | |
|---|---|---|
| CN | 101030041 A | 9/2007 |
| CN | 103907181 A | 7/2014 |

(Continued)

*Primary Examiner* — Deoram Persaud
(74) *Attorney, Agent, or Firm* — Maschoff Brennan (57) ABSTRACT

A method for adhering a reticle onto a top surface of a chuck is provided in accordance with some embodiments of the present disclosure. The method includes sliding a reticle relative to a chuck along a first direction, such that a plurality of fibers over a top surface of the chuck are inclined away from an imaginary line normal to the top surface of the chuck by sliding the reticle relative to the chuck along the first direction; performing a photolithography process using the reticle; and after performing the photolithography process, sliding the reticle relative to the chuck along a second direction opposite to the first direction, such that the fibers are moved back toward the imaginary line by sliding the reticle relative to the chuck along the second direction.

20 Claims, 11 Drawing Sheets (56) References Cited

U.S. PATENT DOCUMENTS

| | | |
|---|---|---|
| 2008/0280085 A1 | 11/2008 | Livne |
| 2009/0115979 A1 | 5/2009 | Van Der Heijden et al. |
| 2012/0237730 A1 | 9/2012 | Sitti et al. |
| 2014/0272272 A1 | 9/2014 | Spenko et al. |
| 2015/0107621 A1 | 4/2015 | Kobayashi et al. |
| 2017/0038676 A1 | 2/2017 | Jung et al. |
| 2018/0149962 A1 | 5/2018 | Kobayashi et al. |
| 2018/0190534 A1 | 7/2018 | Poiesz et al. |

FOREIGN PATENT DOCUMENTS

| | | |
|---|---|---|
| TW | 201523125 A | 6/2015 |
| TW | 201719274 A | 6/2017 |
| TW | 201820030 A | 8/2018 |
| WO | 2008/078992 A1 | 7/2008 |

PHOTOLITHOGRAPHY APPARATUS AND METHOD FOR HANDLING WAFER

CROSS-REFERENCE TO RELATED APPLICATION

This present application is a Continuation Application of U.S. patent application Ser. No. 16/232,952, filed on Dec. 26, 2018, now U.S. Pat. No. 10,768,534, issued on Sep. 8, 2020, which claims priority to U.S. Provisional Application Ser. No. 62/718,958, filed Aug. 14, 2018, which are herein incorporated by reference in their entirety.

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A photolithography process forms a patterned resist layer for various patterning processes, such as etching or ion implantation. The minimum feature size that may be patterned by way of such a photolithography process is limited by the wavelength of the projected radiation source. Photolithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Silicon wafers are manufactured in a sequence of successive lithography steps including mask alignment, exposure, photoresist development, layer etch, and epitaxial layer growth to form a pattern which defines device structures and interconnects within an integrated circuit (IC). To guarantee robust mask alignment, dedicated alignment structures are placed within physical layout data of the IC, and are utilized by an in-line alignment tool within a semiconductor manufacturing flow to achieve overlay (OVL) control during mask alignment. A patterned wafer consists of a plurality of ICs arranged into a periodic array or reticle fields, in which each reticle field is patterned by a step-and-repeat tool configured to align a patterned mask to an individual reticle field based on a wafer map of alignment structure locations obtained from the physical layout data of the IC. Yield and device performance rely upon robust OVL control between two or more mask alignment steps when forming layers of a device.

As the lithography processes become more sophisticated, the OVL quality between a reticle chuck and a mask needs to be improved. To improve the OVL quality, contact area between the reticle chuck and the mask may need to be increased. However, a large contact area leads to a large Van der Waals force, which may cause the difficulty of removing the mask from the reticle chuck. If the mask is forcibly removed, the reticle chuck may be damaged.

Figure 1:
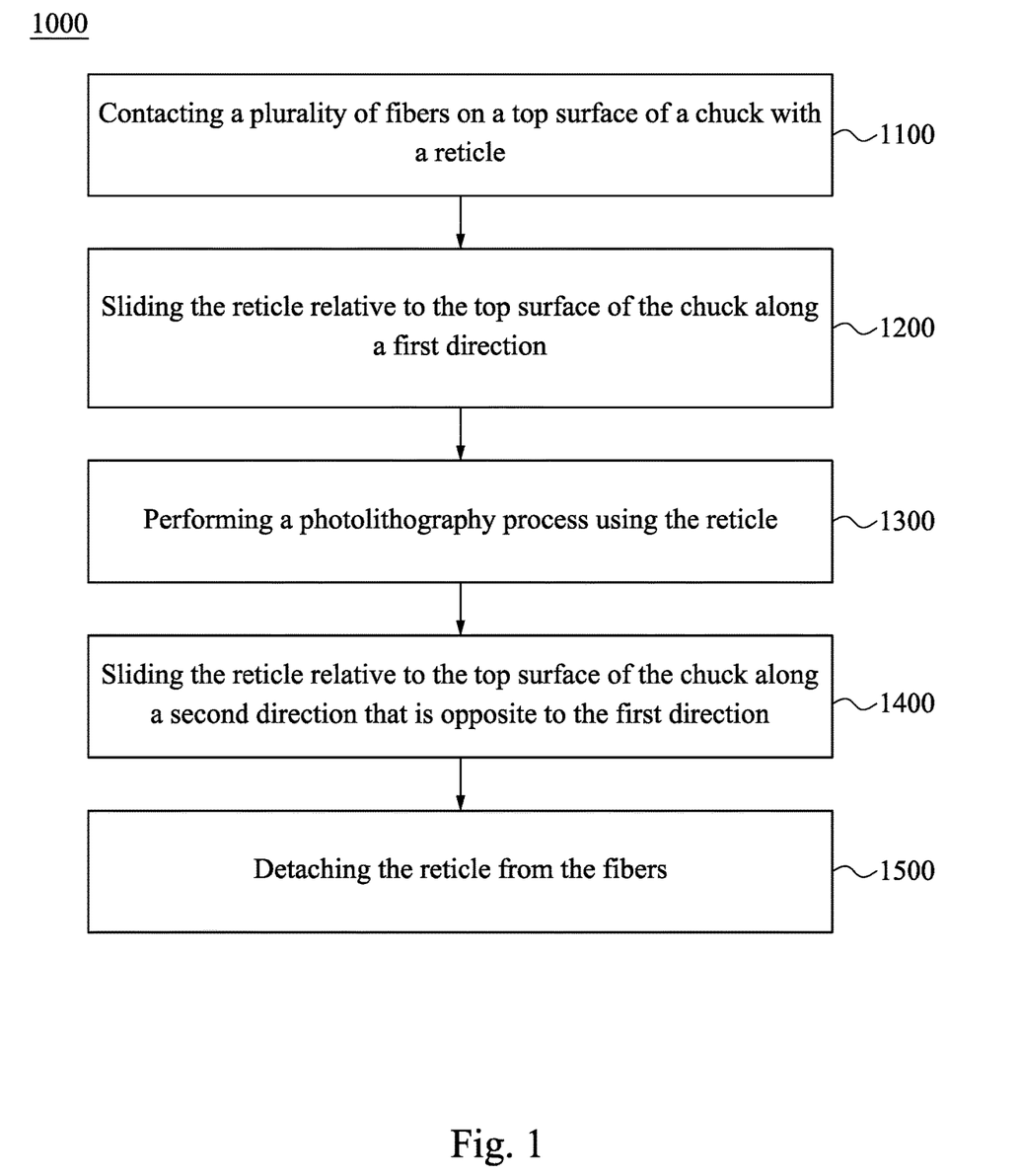
FIG. 1 is a flow chart illustrating a photolithography method in accordance with some embodiments of the instant disclosure.

Reference is made to FIG. 1, a flow chart illustrating a photolithography method 1000 in accordance with some embodiments of the instant disclosure. The method 1000 begins with operation 1100 in which a plurality of flexible or bendable fibers on a top surface of a chuck contact a reticle (i.e., a mask). The method 1000 continues with operation 1200 in which the reticle slides relative to the top surface of the chuck along a first direction to increase a contact area between the fibers and the reticle, such that the reticle is adhered to the fibers. Subsequently, operation 1300 is performed. A photolithography process is performed using the reticle secured on the reticle chuck. The method 1000 continues with operation 1400 in which the reticle slides relative to the top surface of the chuck along a second direction that is opposite to the first direction to decrease a contact area between the fibers and the reticle. The method 1000 continues with operation 1500 in which the reticle is detached from the fibers. The discussion that follows illustrates embodiments of a photolithography apparatus that can be operated according to the method 1000 of FIG. 1. While method 1000 is illustrated and described below as a series of actions or events, it will be appreciated that the illustrated ordering of such actions or events are not to be interpreted in a limiting sense. For example, some actions may occur in different orders and/or concurrently with other actions or events apart from those illustrated and/or described herein. In addition, not all illustrated actions may be required to implement one or more aspects or embodiments of the description herein. Further, one or more of the actions depicted herein may be carried out in one or more separate actions and/or phases.

Figure 2:
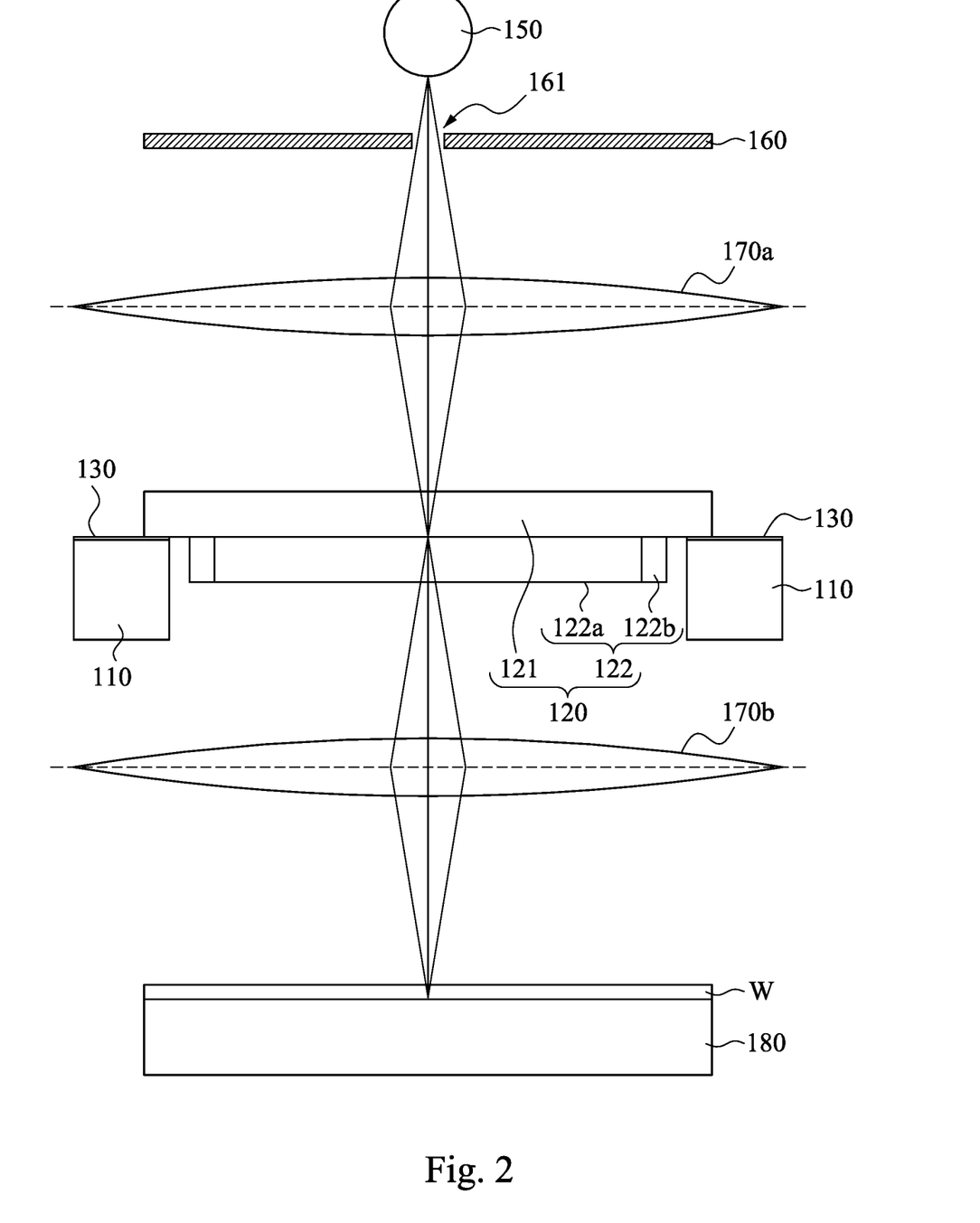
FIG. 2 illustrates a cross-sectional view of a photolithography apparatus in accordance with some embodiments of the instant disclosure.

Reference is made to FIG. 2. FIG. 2 illustrates a cross-sectional view of a photolithography apparatus 100 in accordance with some embodiments of the instant disclosure. The apparatus 100 includes a reticle chuck 110, an adhesive layer 130, a light source 150, a baffle 160, objective lenses 170a, 170b, and a wafer stage 180. The reticle chuck 110 is configured to temporarily secure a reticle 121 of a mask system 120 using the adhesive layer 130. That is, the reticle chuck 110 is a kind of workpiece holding device. The light source 150 is over the reticle chuck 110. The baffle 160 is between the reticle chuck 110 and the light source 150 and has an exposure slit 161. The light source 150 is configured to emit light toward the reticle chuck 110 through the exposure slit 161. The objective lens 170a is between the baffle 160 and the reticle chuck 110 and configured to focus the light emitted by the light source 150 onto the reticle 121. The wafer stage 180 is under the reticle chuck 110 and configured to support a wafer W thereon. The objective lens 170b is between the wafer stage 180 and the reticle chuck 110 and configured to focus the light passing through the reticle 121 onto the wafer W. The apparatus 100 is configured to perform a semiconductor photolithography process of transferring patterns of geometric shapes on the reticle 121 to a thin layer of photosensitive material (called photoresist) covering the surface of the wafer W. That is, the primary exposure method used by the apparatus 100 is projection printing, but the disclosure is not limited in this regard. In some embodiments, the apparatus 100 uses a type of stepper called a scanner, which moves the wafer stage 180 and reticle chuck 110 with respect to each other during the exposure, as a way of increasing the size of the exposed area and increasing the imaging performance of the objective lenses 170a, 170b.

Figure 3:
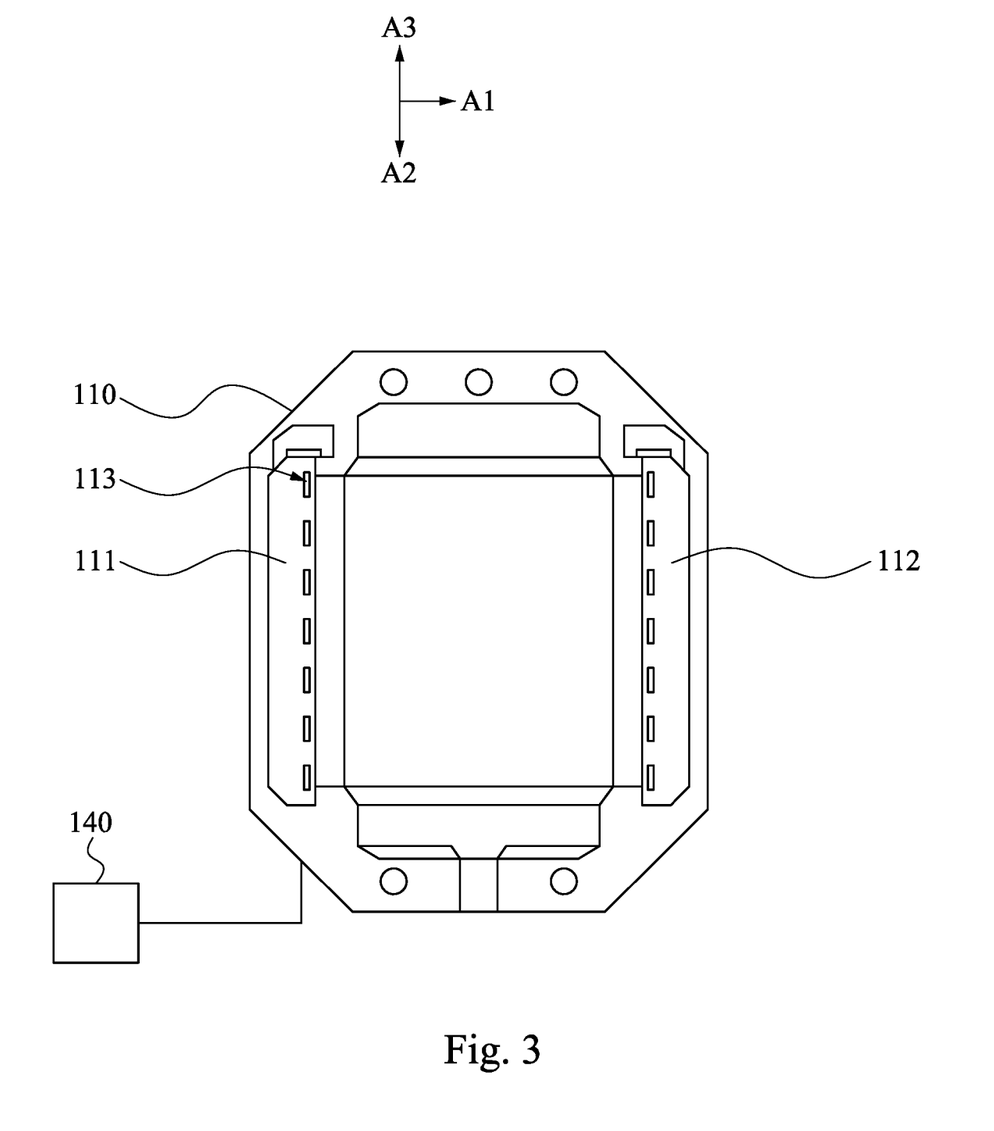
FIG. 3 illustrates a top view of a reticle chuck of a photolithography apparatus in accordance with some embodiments of the instant disclosure.
Figure 4:
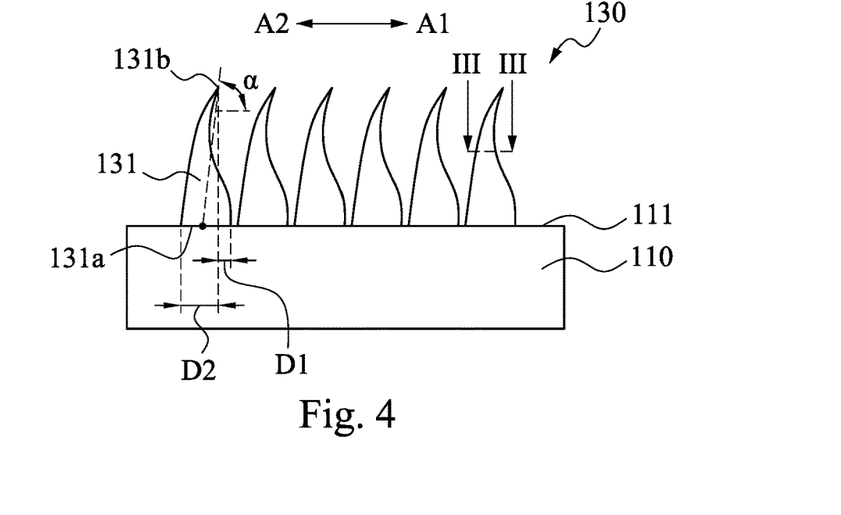
FIG. 4 illustrates a cross-sectional view of the reticle chuck with an adhesive layer thereon in accordance with some embodiments of the instant disclosure.

Reference is made to FIGS. 3 and 4. FIG. 3 illustrates a top view of the reticle chuck 110 of the apparatus 100 in accordance with some embodiments of the instant disclosure. FIG. 4 illustrates a cross-sectional view of the reticle chuck 110 with an adhesive layer 130 thereon in accordance with some embodiments of the instant disclosure. The reticle chuck 110 has a first top surface 111. The adhesive layer 130 is present on the first top surface 111 and includes a plurality of fibers 131. In some embodiments, the adhesive layer 130 is polymer-based dry adhesives or carbon nanotube (CNT)-based dry adhesives. In other words, the fibers 131 may be nano-scaled structures.

In some embodiments as shown in FIG. 4, each of the fibers 131 has a first end 131a and a second end 131b. The first end 131a is connected to the first top surface 111 of the reticle chuck 110, in which a width of the first end 131a of each of the fibers 131 is greater than a width of the second end 131b. Specifically, as shown in FIG. 4, a width of at least one of the fibers 131 is gradually reduced from the first end 131a to the second end 131b of said at least one of the fibers 131. That is, said at least one of the fibers 131 tapers towards its top and is based on bottom-up growth from the first end 131a to the second end 131b like a conical pillar.

In some embodiments, a width of the fibers 131 is substantially in a range from about 0.2 μm to about 0.5 μm. Under the condition that the distance between any two adjacent fibers 131 is constant, a width of the fibers 131 that is greater than about 0.5 μm may make the number of fibers 131 per unit area too small (i.e., the molecular density may be too small) and result in small Van der Waals forces, and a width of the fibers 131 that is smaller than about 0.2 μm may make the number of fibers 131 per unit area too large (i.e., the molecular density may be too large) and cause the fibers 131 to stick to each other, which may worsen adsorption properties of the fibers 131.

In some embodiments, a height of the fibers 131 is substantially in a range from about 1.0 μm to about 1.5 μm. A height of the fibers 131 that is greater than about 1.5 μm may increase the degree of clutter, which may make it difficult to control the inclination direction of the fibers 131. A height of the fibers 131 that is smaller than about 1.0 μm may reduce the contact area between the fibers 131 and the reticle 121, which may reduce the adsorption force of the fibers 131.

In some embodiments as shown in FIG. 4, the second end 131b is configured to bend relative to the first end 131a substantially along a first direction A1 and not along a second direction A2 opposite to the first direction A1, in which the first direction A1 and the second direction A2 are substantially parallel to the first top surface 111 of the reticle chuck 110. In some embodiments, at least one of the fibers 131 is originally inclined toward the first direction A1 relative to the first top surface 111 of the reticle chuck 110 when said at least one of the fibers 131 does not contact the bottom surface 121a (referring to FIG. 7) of the reticle 121. In other words, the first end 131a of said at least one of the fibers 131 has a first side facing along the first direction A1 and a second side facing along the second direction A2, and a vertical projection of the second end 131b of said at least one of the fibers 131 projected onto the first top surface 111 of the reticle chuck 110 is close to the first side of the first end 131a and away from the second side of the first end 131a when said at least one of the fibers 131 does not contact the bottom surface 121a of the reticle 121. Specifically, as shown in FIG. 4, a distance D1 represents a minimum distance between the vertical projection of the second end 131b (on the surface 111) and the first side of the first end 131a, a distance D2 represents a minimum distance between the vertical projection of the second end 131b (on the surface 111) and the second side of the first end 131a, and the distance D1 is different from distance D2. In some embodiments, said at least one of the fibers 131 originally inclines relative to the first top surface 111 of the reticle chuck 110 at an inclined angle α substantially smaller than about 80 degrees when said at least one of the fibers 131 does not contact the bottom surface 121a of the reticle 121. In some embodiments, the inclined angle α of said at least one of the fibers 131 is defined by an angle formed between the first top surface 111 of the reticle chuck 110 and a connection line connecting the first end 131a (e.g., a center of the first end 131a) and the second end 131b of said at least one of the fibers 131, for example.

Figure 5:
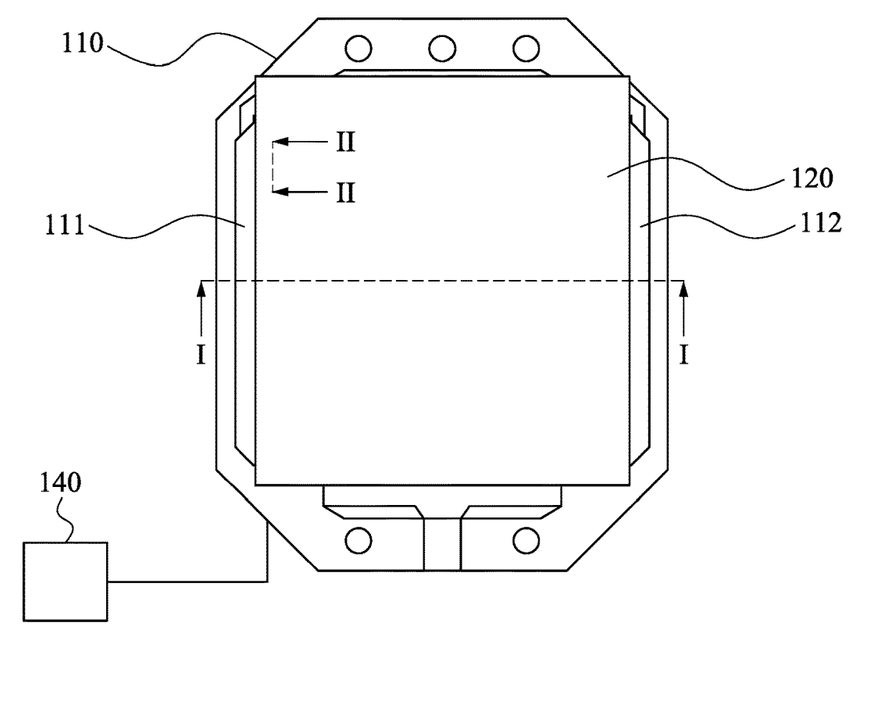
FIG. 5 illustrates a top view of an intermediary stage of operating the photolithography apparatus in accordance with some embodiments of the instant disclosure.
Figure 6:
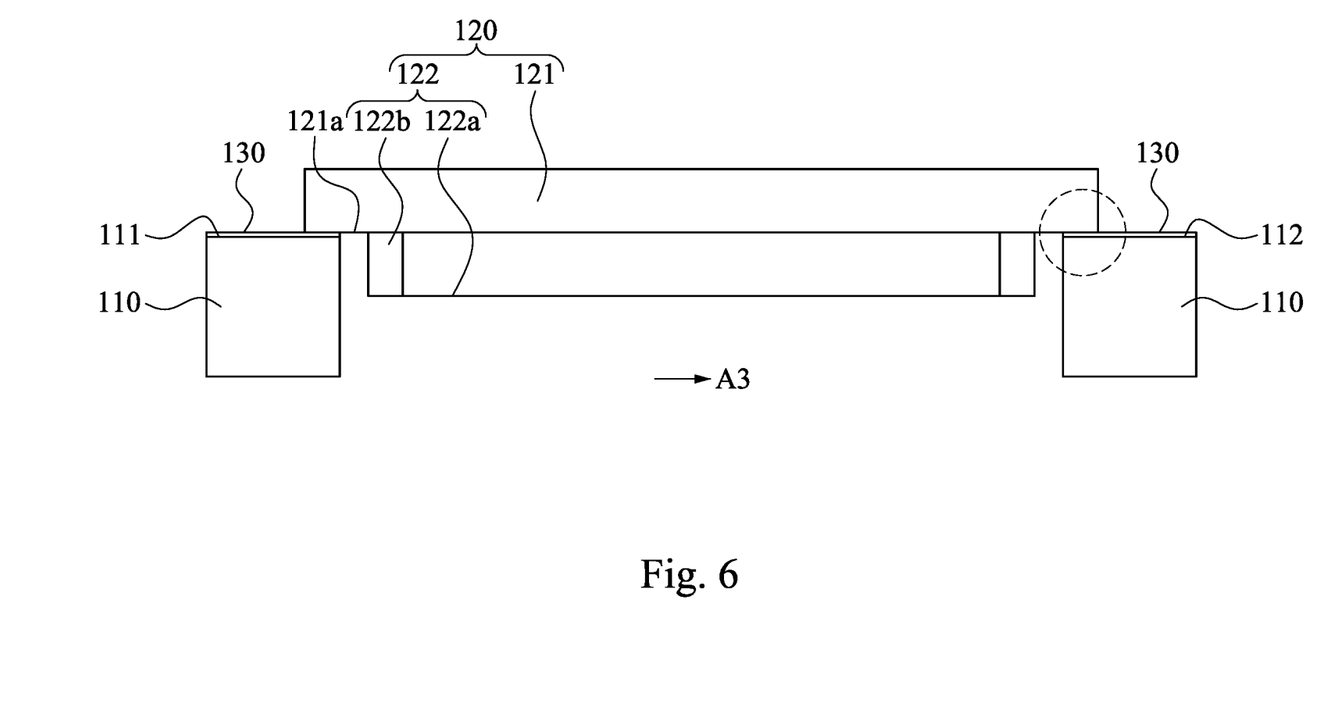
FIGS. 6 through 8 illustrate cross-sectional views of intermediary stages of operating the photolithography apparatus in accordance with some embodiments of the instant disclosure.
Figure 7:
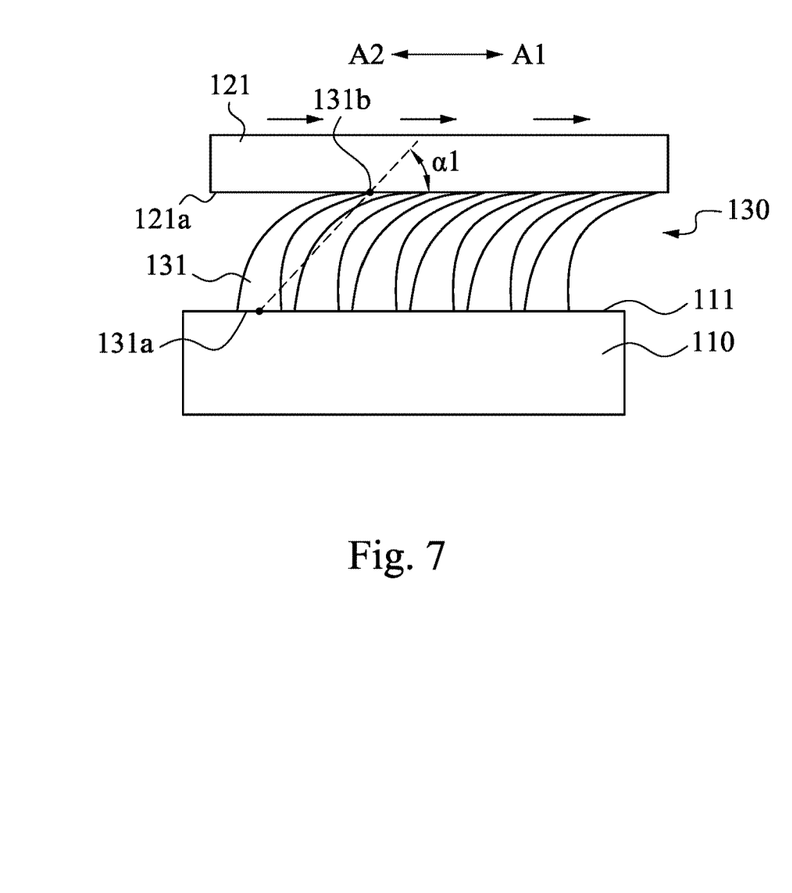
Figure 8:
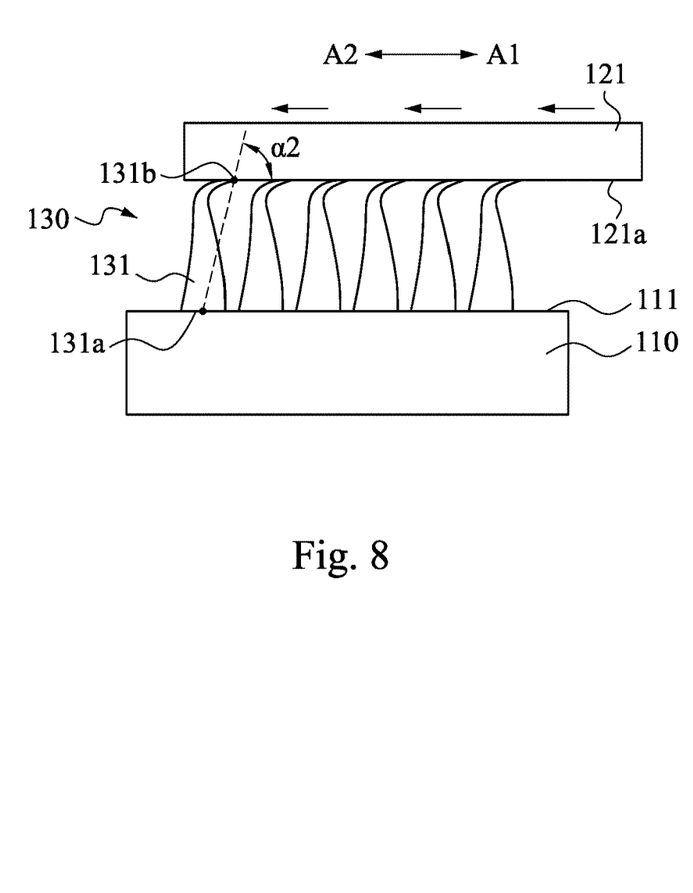

FIG. 5 illustrates a top view of an intermediary stage of operating the photolithography apparatus in accordance with some embodiments of the instant disclosure. FIGS. 6 through 8 illustrate cross-sectional views of intermediary stages of operating the photolithography apparatus in accordance with some embodiments of the instant disclosure. FIG. 6 illustrates a partial cross-section taken along line I-I illustrated in FIG. 5. FIGS. 7 and 8 illustrate partial cross-sections taken along line II-II illustrated in FIG. 5.

Reference is made to FIGS. 3, 5, and 6. As shown in FIG. 3, the reticle chuck 110 further has a second top surface 112. The second top surface 112 is parallel to, substantially coplanar with, and spaced apart from the first top surface 111, and the adhesive layer 130 is further present on the second top surface 112. As shown in FIGS. 5 and 6, the adhesive layer 130 present on the first top surface 111 and the second top surface 112 of a reticle chuck 110 contacts the bottom surface 121a of a reticle 121.

Reference is made to FIGS. 6 and 7. The adhesive layer 130 present on the first top surface 111 and the second top surface 112 of the reticle chuck 110 contacts the bottom surface 121a of the reticle 121. After the adhesive layer 130 contacts the bottom surface 121a, the bottom surface 121a of the reticle 121 slides relative to the first top surface 111 and the second top surface 112 of the reticle chuck 110 along the first direction A1, so as to increase a contact area between the fibers 131 and the bottom surface 121a of the reticle 121. At the same time, at least one of the fibers 131 present on the first top surface 111 inclines relative to the first top surface 111 at a first inclined angle α1 and adheres to the bottom surface 121a of the reticle 121 with a first adhesive force. In some embodiments, after the reticle 121 is secured onto the first top surface 111 and the second top surface 112 of the reticle chuck 110, a photolithography process is performed using the reticle 121.

In some embodiments as shown in FIG. 7, the first inclined angle α1 is substantially in a range from about 0 degree to about 10 degrees. On the other hand, the second end 131b of said at least one of the fibers 131 bends relative to the first end 131a substantially along the first direction A1 at the same time. In some embodiments, a bending angle of said at least one of the fibers 131 as shown in FIG. 7 relative to said at least one of the fibers 131 as shown in FIG. 4 is substantially in a range from about 70 degrees to about 80 degrees (i.e., the inclined angle α minus the first inclined angle α1), but the disclosure is not limited in this regard.

In some embodiments, in order to properly secure the reticle 121 onto the reticle chuck 110, a height of the fibers 131 squeezed between the reticle 121 and the reticle chuck 110 is substantially in a range from about 0.5 μm to about 0.8 μm. A height of the squeezed fibers 131 that is greater than about 0.8 μm may create a relatively small contact area and thus result in a poor adsorption force, so the reticle 121 is prone to falling from the reticle chuck 110. A height of the squeezed fibers 131 that is smaller than about 0.5 μm may make the molecular density of the fibers 131 too large and cause the fibers 131 to stick to each other, which may worsen adsorption properties of the fibers 131 and make the reticle 121 prone to falling from the reticle chuck 110.

In some embodiments as shown in FIG. 6, the reticle 121 includes a substrate and a patterned layer that defines an integrated circuit to be transferred to a semiconductor substrate (e.g., the wafer shown in FIG. 2) during the photolithography process. The reticle 121 is typically included with a pellicle assembly 122, collectively referred to as the aforementioned mask system 120. The pellicle assembly 122 includes a transparent thin membrane 122a and a pellicle frame 122b. The pellicle frame 122b is mounted on the bottom surface 121a of the reticle 121. The transparent thin membrane 122a is mounted over the pellicle frame 122b. The pellicle assembly 122 protects the reticle 121 from fallen particles and keeps the particles out of focus so that they do not produce a patterned image, which may cause defects when the reticle 121 is being used. The transparent thin membrane 122a is typically stretched and mounted over the pellicle frame 122b, and is attached to the pellicle frame 122b by glue or other adhesives.

In some embodiments, the first top surface 111 and the second top surface 112 substantially extend along the first direction A1 and the second direction A2, and are arranged with respect to each other in a third direction A3 inclined relative to the first direction A1 and the second direction A2. In some embodiments, the third direction A3 is perpendicular to the first direction A1 and the second direction A2, but the disclosure is not limited in this regard. As shown in FIGS. 5 and 6, two opposite side edges of the reticle 121 are respectively supported on the first top surface 111 and the second top surface 112 of the reticle chuck 110. Meanwhile, the pellicle assembly 122 of the mask system 120 extends between and is spaced apart from the first top surface 111 and the second top surface 112. In this way, the pellicle assembly 122 will not collide with the reticle chuck 110 when the bottom surface 121a of the reticle 121 slides relative to the first top surface 111 and the second top surface 112 along the first direction A1.

In some embodiments as shown in FIG. 3, the reticle chuck 110 has a plurality of vacuum holes 113. Each of the vacuum holes 113 is communicated to one of the first top surface 111 and the second top surface 112. The apparatus 100 further includes a vacuum source 140. The vacuum source 140 is in fluid communication with the plurality of vacuum holes 113 and is configured to form a low pressure vacuum between the first top surface 111 and the bottom surface 121a of the reticle 121 and between the second top surface 112 and the bottom surface 121a through the vacuum holes 113 when the bottom surface 121a covers the vacuum holes 113. Each of the vacuum holes 113 of the reticle chuck 110 is surrounded by the fibers 131.

In some embodiments, the vacuum source 140 form the low pressure vacuum between the first top surface 111 and the bottom surface 121a and between the second top surface 112 and the bottom surface 121a through the vacuum holes 113 after the bottom surface 121a of the reticle 121 slides relative to the first top surface 111 and the second top surface 112 along the first direction A1 and before the photolithography process is performed. In some other embodiments, the vacuum source 140 form the low pressure vacuum between the first top surface 111 and the bottom surface 121a and between the second top surface 112 and the bottom surface 121a through the vacuum holes 113 after the adhesive layer 130 present on the first top surface 111 and the second top surface 112 of the reticle chuck 110 contacts the bottom surface 121a of the reticle 121 and before the bottom surface 121a slides relative to the first top surface 111 and the second top surface 112 along the first direction A1.

In some embodiments, the vacuum holes 113 on either the first top surface 111 or the second top surface 112 are elongated along the third direction A3 and sequentially arranged in a line along the third direction A3, but the disclosure is not limited in this regard.

Reference is made to FIGS. 6 and 8. After the photolithography process is performed using the reticle 121, the bottom surface 121a of the reticle 121 slides relative to the first top surface 111 and the second top surface 112 of the reticle chuck 110 along the second direction A2, so as to elevate the reticle 121 and decrease a contact area between the fibers 131 and the bottom surface 121a of the reticle 121. At the same time, at least one of the fibers 131 present on the first top surface 111 inclines relative to the first top surface 111 at a second inclined angle α2 and adheres to the bottom surface 121a of the reticle 121 with a second adhesive force, in which the first adhesive force is greater than the second adhesive force. In some embodiments, the reticle chuck 110 may include glass, quartz, a combination thereof, or the like. In some embodiments, the reticle 121 may include glass, quartz, silicon, silicon carbide, black diamond, combinations thereof, or the like. As such, the reticle 121 of the mask system 120 can be then detached from the reticle chuck 110 under a smaller adhesive force produced by the adhesive layer 130, so that the reticle 121 and the reticle chuck 110 can be effectively prevented from breakage during detaching. In some embodiments as shown in FIGS. 7 and 8, the first inclined angle α1 is smaller than the second inclined angle α2.

In other words, by sliding the bottom surface 121a of the reticle 121 relative to the first top surface 111 and the second top surface 112 of the reticle chuck 110 substantially along the first direction A1, the Van der Waals force produced between the adhesive layer 130 and the bottom surface 121a of the reticle 121 can be increased, so as to effectively improve the OVL quality between the reticle chuck 110 and the reticle 121. By sliding the bottom surface 121a of the reticle 121 relative to the first top surface 111 and the second top surface 112 of the reticle chuck 110 substantially along the second direction A2, the Van der Waals force produced between the adhesive layer 130 and the bottom surface 121a of the reticle 121 can be decreased, so as to easily detach the reticle 121 from the reticle chuck 110 without breaking the reticle chuck 110.

In some embodiments as shown in FIG. 8, the second inclined angle α2 is substantially in a range from about 30 degrees to about 80 degrees. At the same time, the second end 131b of said at least one of the fibers 131 still bends relative to the first end 131a substantially along the first direction A1. In some embodiments, a bending angle of said at least one of the fibers 131 as shown in FIG. 8 relative to said at least one of the fibers 131 as shown in FIG. 4 is substantially in a range from about 0 degree to about 50 degrees (i.e., the inclined angle α minus the second inclined angle α2), but the disclosure is not limited in this regard.

In some embodiments with the vacuum source 140 forming the low pressure vacuum between the first top surface 111 and the bottom surface 121a and between the second top surface 112 and the bottom surface 121a through the vacuum holes 113 before the photolithography process is performed, the low pressure vacuum can be removed by controlling the vacuum source 140 after the bottom surface 121a slides relative to the first top surface 111 and the second top surface 112 along the second direction A2 and before the reticle 121 of the mask system 120 is detached from the reticle chuck 110. In some other embodiments, the low pressure vacuum can be removed by controlling the vacuum source 140 after the photolithography process is performed and before the bottom surface 121a slides relative to the first top surface 111 and the second top surface 112 along the second direction A2.

Figure 9:
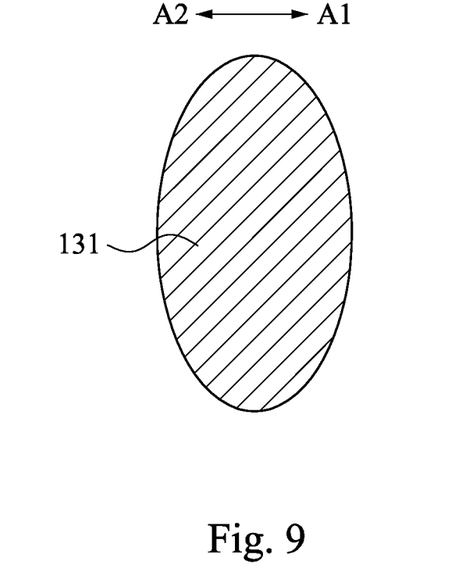
FIG. 9 illustrates a cross-sectional view of one fiber of the adhesive layer in FIG. 4 in accordance with some embodiments of the instant disclosure.

Reference is made to FIG. 9. FIG. 9 illustrates a cross-sectional view of one of the fibers 131 of the adhesive layer 130 in FIG. 4 in accordance with some embodiments of the instant disclosure, in which a cross-section of said one of the fibers 131 is taken along line III-III. In some embodiments as illustrated in FIG. 9, the cross-section of said one of the fibers 131 is parallel to the first top surface 111 of the reticle chuck 110 and is noncircular. For example, a width of the cross-section in a direction inclined relative to the first direction A1 is greater than a width of the cross-section in the first direction A1, so that the second end 131b of said one of the fibers 131 is apt to bend relative to the first end 131a substantially along the first direction A1. In some embodiments, the cross-section has a largest width in a direction perpendicular to the first direction A1 and has a smallest width in the first direction A1, but the disclosure is not limited in this regard.

Figure 10:
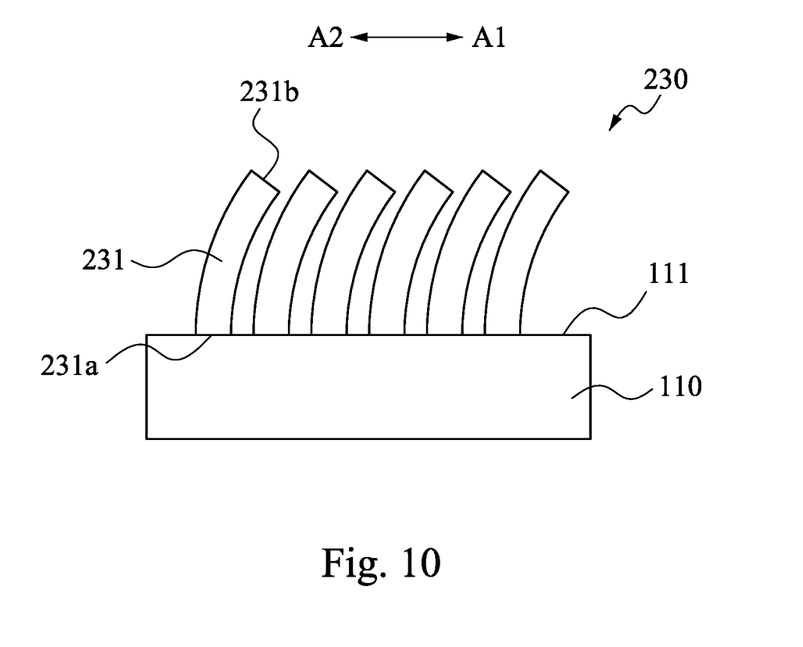
FIG. 10 illustrates a cross-sectional view of the reticle chuck with an adhesive layer thereon in accordance with some embodiments of the instant disclosure.

Reference is made to FIG. 10. FIG. 10 illustrates a cross-sectional view of a reticle chuck 110 with an adhesive layer 230 thereon in accordance with some embodiments of the instant disclosure. The adhesive layer 230 is present on the first top surface 111 and includes a plurality of fibers 231. In some embodiments, the adhesive layer 230 is polymer-based dry adhesives or CNT-based dry adhesives. In other words, the fibers 231 may be nano-scaled structures. In some embodiments, each of the fibers 231 has a first end 231a and a second end 231b. The first end 231a is connected to the first top surface 111 of the reticle chuck 110. In some other embodiments, at least one of the fibers 231 substantially has a uniform width. In other words, in such embodiments, the first end 231a and the second end 231b of said at least one of the fibers 231 substantially have the same width, and said at least one of the fibers 231 is based on bottom-up growth from the first end 231a to the second end 231b like a straight pillar.

Figure 11:
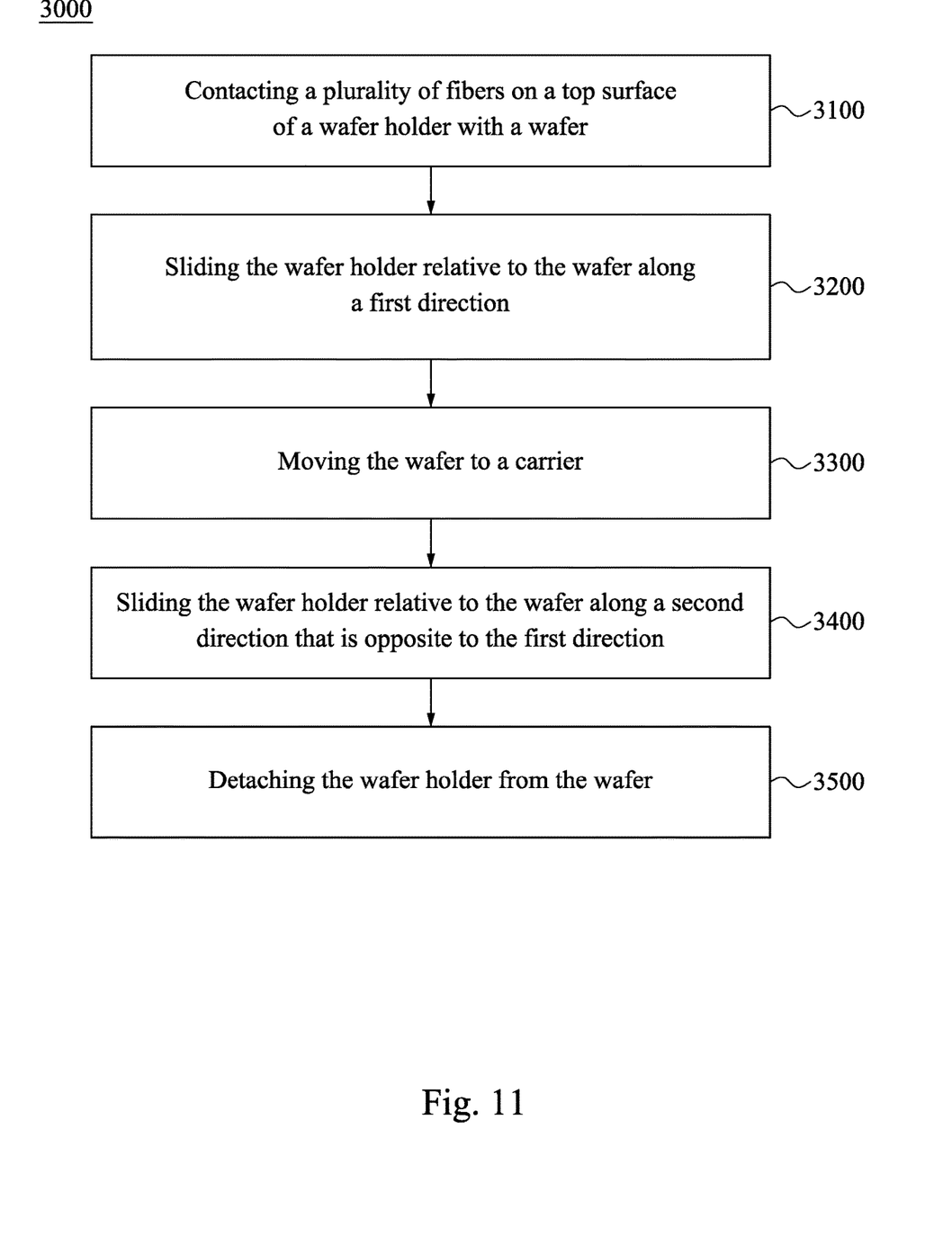
FIG. 11 is a flow chart illustrating a method for handling a wafer in accordance with some embodiments of the instant disclosure.

Reference is made to FIG. 11, a flow chart illustrating a method 3000 for handling a wafer in accordance with some embodiments of the instant disclosure. The method 3000 begins with operation 3100 in which a plurality of fibers on a top surface of a wafer holder contacts a wafer. The method 3000 continues with operation 3200 in which the wafer holder slides relative to the wafer along a first direction to incline the fibers relative to the top surface of the wafer holder, such that the wafer is adhered to the fibers. The method 3000 continues with operation 3300 in which the wafer moves to a carrier using a robot to drive a mechanical arm connected to the wafer holder. The method 3000 continues with operation 3400 in which the wafer holder slides relative to the wafer along a second direction that is opposite to the first direction to decrease a contact area between the fibers and the wafer. The method 3000 continues with operation 3500 in which the wafer holder is detached from the wafer to leave the wafer on the carrier. The discussion that follows illustrates embodiments of a photolithography apparatus that can be operated according to the method 3000 of FIG. 11. While method 3000 is illustrated and described below as a series of actions or events, it will be appreciated that the illustrated ordering of such actions or events are not to be interpreted in a limiting sense. For example, some actions may occur in different orders and/or concurrently with other actions or events apart from those illustrated and/or described herein. In addition, not all illustrated actions may be required to implement one or more aspects or embodiments of the description herein. Further, one or more of the actions depicted herein may be carried out in one or more separate actions and/or phases.

Figure 12:
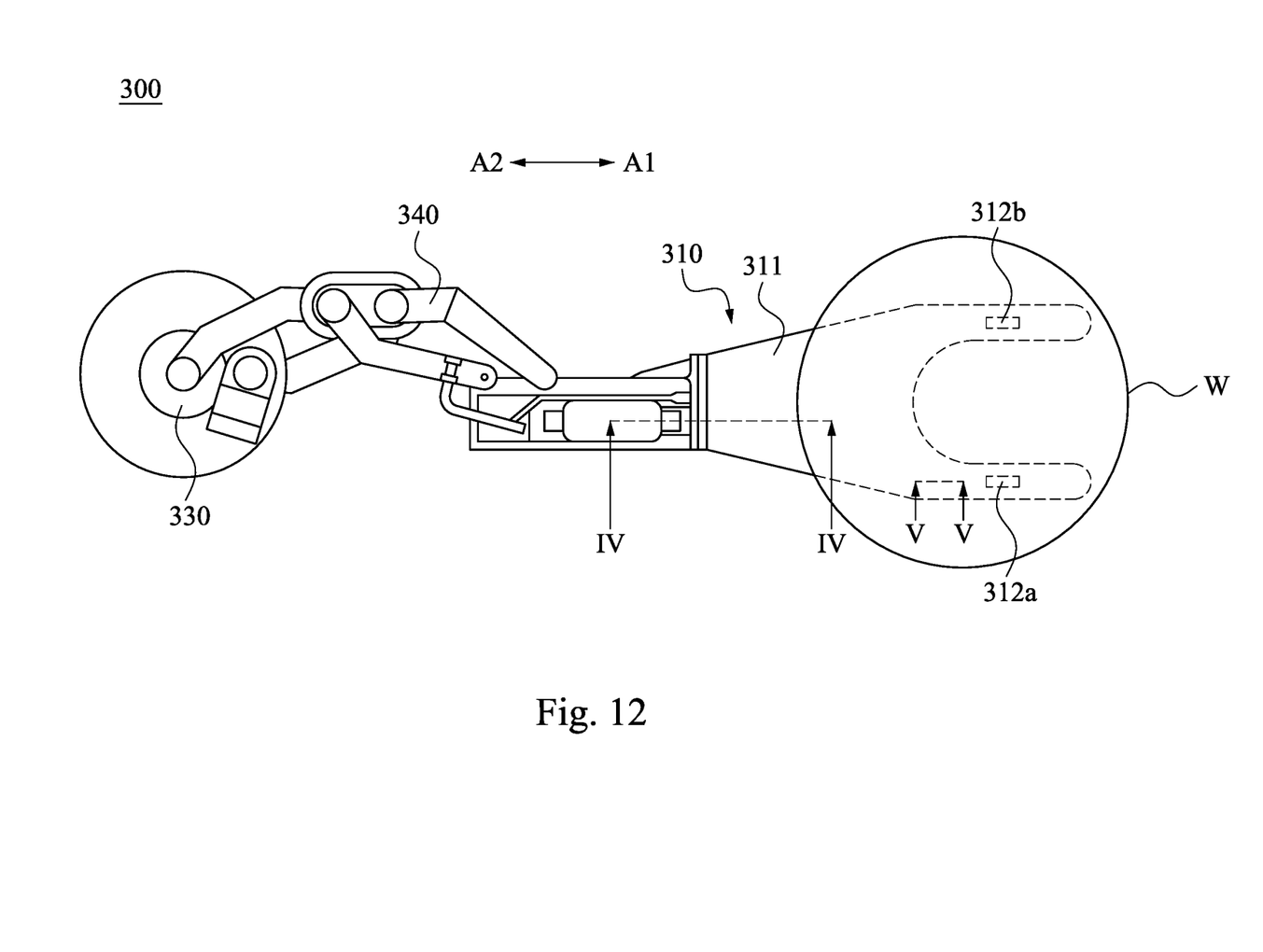
FIG. 12 illustrates a top view of a wafer handler with a wafer thereon in accordance with some embodiments of the instant disclosure.
Figure 13:
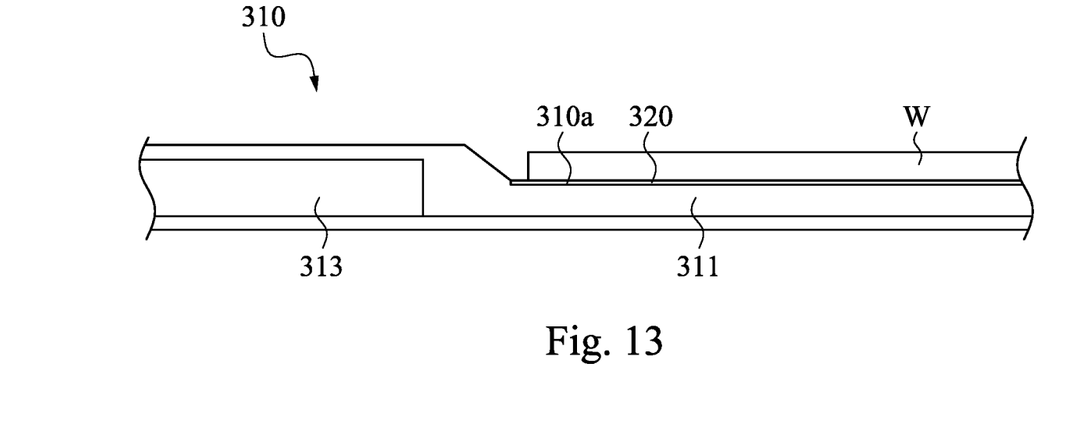
FIG. 13 illustrates a cross-sectional view of the wafer handler in accordance with some embodiments of the instant disclosure.

Reference is made to FIGS. 12 and 13. FIG. 12 illustrates a top view of a wafer handler 300 with a wafer W thereon in accordance with some embodiments of the instant disclosure. FIG. 13 illustrates a cross-sectional view of the wafer handler 300 taken along line IV-IV illustrated in FIG. 12 in accordance with some embodiments of the instant disclosure. The wafer handler 300 includes a wafer holder 310, an adhesive layer 320, a robot 330, and a mechanical arm 340. The wafer holder 310 has a top surface 310a configured to carry a wafer W thereon. That is, the wafer holder 310 is a kind of workpiece holding device. The wafer holder 310 is constructed of a blade portion 311, a pair of object sensors 312a, 312b mounted in the top surface 310a, and a printed circuit board 313 for controlling the object sensors 312a, 312b. The object sensors 312a, 312b are utilized to sense the presence of the wafer W which is properly positioned on the blade portion 311. The adhesive layer 320 is present on the top surface 310a of the wafer holder 310 and includes a plurality of fibers 321. In some embodiments, the adhesive layer 320 is polymer-based dry adhesives or carbon nanotube (CNT)-based dry adhesives. In other words, the fibers 321 are nano-scaled structures. The mechanical arm 340 is connected between the robot 330 and the wafer holder 310. The robot 330 is configured to drive the mechanical arm 340 to move the wafer holder 310 away from the robot 330 along a first direction A1 and configured to drive the mechanical arm 340 to move the wafer holder 310 toward the robot 330 along a second direction A2 opposite to the first direction A1. In some embodiments, the first direction A1 and the second direction A2 are substantially parallel to the top surface 310a of the wafer holder 310.

Figure 14:
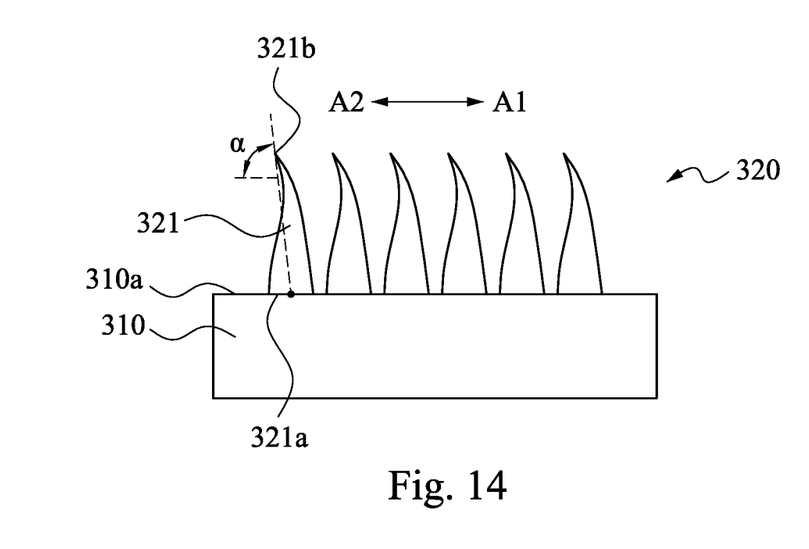
FIG. 14 illustrates a cross-sectional view of the wafer holder with an adhesive layer thereon in accordance with some embodiments of the instant disclosure.

Reference is made to FIG. 14. FIG. 14 illustrates a cross-sectional view of the wafer holder 310 with the adhesive layer 320 thereon taken along line V-V illustrated in FIG. 12 in accordance with some embodiments of the instant disclosure. In some embodiments as shown in FIG. 14, each of the fibers 321 has a first end 321a and a second end 321b. The first end 321a is connected to the top surface 310a of the wafer holder 310, in which width of the first end 321a of each of the fibers 321 is greater than a width of the second end 321b. Specifically, as shown in FIG. 14, widths of at least one of the fibers 321 are gradually reduced from the first end 321a to the second end 321b of said at least one of the fibers 321. That is, said at least one of the fibers 321 tapers towards its top and is based on bottom-up growth from the first end 321a to the second end 321b like a conical pillar.

In some embodiments, a width of the fibers 321 is substantially in a range from about 0.2 µm to about 0.5 µm. Under the condition that the distance between any two adjacent fibers 321 is constant, a width of the fibers 321 that is greater than about 0.5 µm may make the number of fibers 321 per unit area too small (i.e., the molecular density may be too small) and result in small Van der Waals forces, and a width of the fibers 321 that is smaller than about 0.2 µm may make the number of fibers 321 per unit area too large (i.e., the molecular density may be too large) and cause the fibers 321 to stick to each other, which may worsen adsorption properties of the fibers 321.

In some embodiments, a height of the fibers 321 is substantially in a range from about 1.0 µm to about 1.5 µm. A height of the fibers 321 that is greater than about 1.5 µm may increase the degree of clutter, which may make it difficult to control the inclination direction of the fibers 321. A height of the fibers 321 that is smaller than about 1.0 µm may reduce the contact area between the fibers 321 and the wafer W, which may reduce the adsorption force of the fibers 321.

In some other embodiments, at least one of the fibers 321 substantially has a uniform width like the fiber 131 shown in FIG. 10. In other words, in such embodiments, the first end 321a and the second end 321b of said at least one of the fibers 321 substantially have the same width, and said at least one of the fibers 321 is based on bottom-up growth from the first end 321a to the second end 321b like a straight pillar.

In some embodiments as shown in FIG. 14, the second end 321b is configured to bend relative to the first end 321a substantially along the second direction A2 and not along the first direction A1. In some embodiments, at least one of the fibers 321 is originally inclined toward the second direction A2 relative to the top surface 310a of the wafer holder 310 when said at least one of the fibers 321 does not contact the wafer W. In other words, the first end 321a of said at least one of the fibers 321 has a first side facing along the first direction A1 and a second side facing along the second direction A2, and a vertical projection of the second end 321b of said at least one of the fibers 321 projected onto the top surface 310a of the wafer holder 310 is close to the second side of the first end 321a and away from the first side of the first end 321a when said at least one of the fibers 321 does not contact the wafer W. In some embodiments, said at least one of the fibers 321 originally inclines relative to the top surface 310a of the wafer holder 310 at an inclined angle α substantially smaller than about 80 degrees when said at least one of the fibers 321 does not contact the wafer W. In some embodiments, the inclined angle α of said at least one of the fibers 321 is defined by an angle formed between the top surface 310a of the wafer holder 310 and a connection line connecting the first end 321a (e.g., a center of the first end 321a) and the second end 321b of said at least one of the fibers 321, for example.

In some embodiments, a cross-section of at least one of the fibers 321 parallel to the top surface 310a of the wafer holder 310 is noncircular like the cross-section of the fiber 131 shown in FIG. 9. For example, a width of the cross-section in a direction inclined relative to the second direction A2 is greater than a width of the cross-section in the second direction A2, so that the second end 321b of said at least one of the fibers 321 is apt to bend relative to the first end 321a substantially along a second direction A2. In some embodiments, the cross-section has a largest width in a direction perpendicular to the second direction A2 and has a smallest width in the second direction A2, but the disclosure is not limited in this regard.

Figure 15:
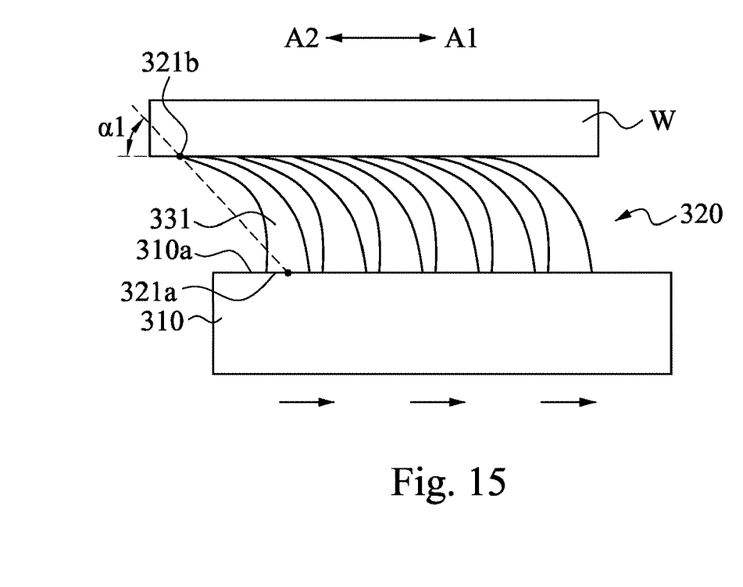
FIGS. 15 through 16 illustrate cross-sectional views of intermediary stages of operating the wafer handler in accordance with some embodiments of the instant disclosure.
Figure 16:
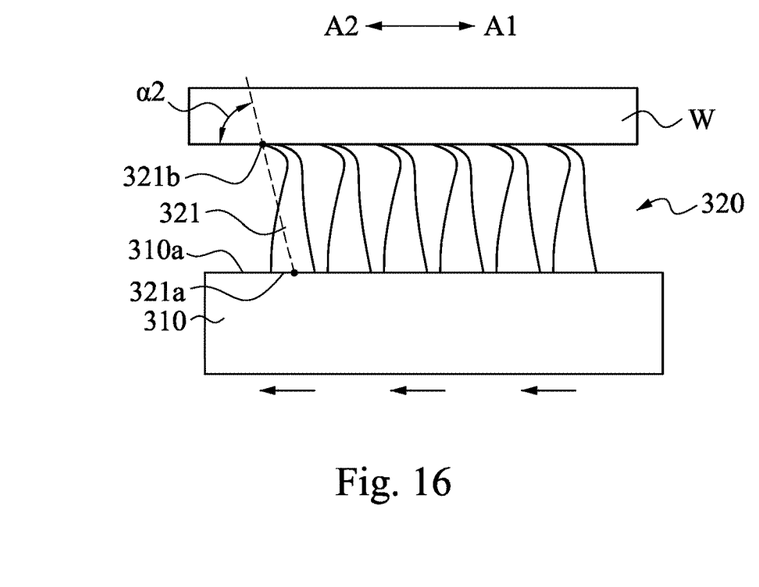

FIGS. 15 through 16 illustrate cross-sectional views of intermediary stages of operating the wafer handler 300 in accordance with some embodiments of the instant disclosure. FIGS. 15 and 16 illustrate partial cross-sections taken along line V-V illustrated in FIG. 12.

Reference is made to FIGS. 14 and 15. The adhesive layer 320 present on the top surface 310a of the wafer holder 310 contacts the wafer W. After the adhesive layer 320 contacts the wafer W, the top surface 310a of the wafer holder 310 slides relative to the wafer W along the first direction A1, so as to increase a contact area between the fibers 321 and the wafer W. At the same time, at least one of the fibers 321 present on the top surface 310a inclines relative to the top surface 310a at a first inclined angle α1 and adheres to the wafer W with a first adhesive force. In some embodiments, after the wafer W is secured onto the top surface 310a of the wafer holder 310, the wafer W is moved to a carrier using the robot 330 to drive the mechanical arm 340 connected to the wafer holder 310. In some embodiments, the carrier is a cassette pod or an electrostatic chuck in a processing chamber, for example.

In some embodiments as shown in FIG. 15, the first inclined angle α1 is substantially in a range from about 0 degree to about 10 degrees. On the other hand, the second end 321b of said at least one of the fibers 321 bends relative to the first end 321a substantially along the second direction A2 at the same time. In some embodiments, a bending angle of said at least one of the fibers 321 as shown in FIG. 15 relative to said at least one of the fibers 321 as shown in FIG. 14 is substantially in a range from about 70 degrees to about 80 degrees (i.e., the inclined angle α minus the first inclined angle α1), but the disclosure is not limited in this regard.

In some embodiments, in order to properly secure the wafer W onto the wafer holder 310, a height of the fibers 321 squeezed between the wafer W and the wafer holder 310 is substantially in a range from about 0.5 μm to about 0.8 μm. A height of the squeezed fibers 321 that is greater than about 0.8 μm may create a relatively small contact area and thus result in a poor adsorption force, so the wafer W is prone to falling from the wafer holder 310. A height of the squeezed fibers 321 smaller than about 0.5 μm may make the molecular density of the fibers 321 too large and cause the fibers 321 to stick to each other, which may worsen adsorption properties of the fibers 321 and make the wafer W prone to falling from the wafer holder 310.

Reference is made to FIGS. 14 and 16. After the wafer W is moved to the carrier, the top surface 310a of the wafer holder 310 slides relative to the wafer W along the second direction A2, so as to decrease a contact area between the fibers 321 and the wafer W. At the same time, at least one of the fibers 321 present on the top surface 310a inclines relative to the top surface 310a at a second inclined angle α2 and adheres to the wafer W with a second adhesive force, in which the first adhesive force is greater than the second adhesive force. As such, the wafer W can be then detached from the wafer holder 310 under a smaller adhesive force produced by the adhesive layer 320, so that the wafer W can be effectively prevented from breakage during detaching. In some embodiments as shown in FIGS. 15 and 16, the first inclined angle α1 is smaller than the second inclined angle α2.

In other words, by sliding the top surface 310a of the wafer holder 310 relative to the wafer W substantially along the first direction A1, the Van der Waals force produced between the adhesive layer 320 and the wafer W can be increased, so as to effectively improve the OVL quality between the wafer holder 310 and the wafer W. By sliding the top surface 310a of the wafer holder 310 relative to the wafer W substantially along the second direction A1, the Van der Waals force produced between the adhesive layer 320 and the wafer W can be decreased, so as to easily detach the wafer W from the wafer holder 310 without breaking the wafer W.

In some embodiments as shown in FIG. 16, the second inclined angle α2 is substantially in a range from about 30 degrees to about 80 degrees. At the same time, the second end 321b of said at least one of the fibers 321 still bends relative to the first end 321a substantially along the second direction A2. In some embodiments, a bending angle of said at least one of the fibers 321 as shown in FIG. 16 relative to said at least one of the fibers 321 as shown in FIG. 14 is substantially in a range from about 0 degree to about 50 degrees, but the disclosure is not limited in this regard.

In some embodiments, a method includes sliding a reticle relative to a chuck along a first direction, such that a plurality of fibers over a top surface of the chuck are inclined away from an imaginary line normal to the top surface of the chuck by sliding the reticle relative to the chuck along the first direction; performing a photolithography process using the reticle; and after performing the photolithography process, sliding the reticle relative to the chuck along a second direction opposite to the first direction, such that the fibers are moved back toward the imaginary line by sliding the reticle relative to the chuck along the second direction.

In some embodiments, a method includes sliding a wafer holder relative to a wafer along a first direction, such that a plurality of fibers over a top surface of the wafer holder are inclined away from an imaginary line normal to the top surface of the wafer holder by sliding the wafer holder relative to the wafer along the first direction; moving, using the wafer holder, the wafer to a carrier; and after moving the wafer to the carrier, sliding the wafer holder relative to the wafer along a second direction opposite to the first direction, such that the fibers are moved back toward the imaginary line by sliding the wafer holder relative to the wafer along the second direction.

In some embodiments, an apparatus includes a workpiece holding device and a plurality of bendable fibers. The workpiece holding device is configured to hold a workpiece. The bendable fibers are over a top surface of the workpiece holding device and configured to contact the workpiece, wherein the bendable fibers are inclined relative to the top surface of the workpiece holding device at an angle smaller than about 80 degrees and greater than about 30 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
sliding a reticle relative to a chuck along a first direction, such that a plurality of fibers over a top surface of the chuck are inclined away from an imaginary line normal to the top surface of the chuck by sliding the reticle relative to the chuck along the first direction;

performing a photolithography process using the reticle; and after performing the photolithography process, sliding the reticle relative to the chuck along a second direction opposite to the first direction, such that the fibers are moved back toward the imaginary line by sliding the reticle relative to the chuck along the second direction.

2. The method of claim 1, wherein sliding the reticle relative to the chuck along the first direction is performed such that the fibers are in contact with the reticle.

3. The method of claim 1, wherein sliding the reticle relative to the chuck along the first direction is performed such that an inclined angle of at least one of the fibers is in a range from about 0 degree to about 10 degrees, and the inclined angle is between a bottom surface of the reticle and a connection line connecting a top end and a bottom end of said at least one of the fibers.

4. The method of claim 1, wherein sliding the reticle relative to the chuck along the second direction is performed such that an inclined angle of at least one of the fibers is in a range from about 30 degree to about 80 degrees, and the inclined angle is between a bottom surface of the reticle and an imaginary line connecting a top end and a bottom end of said at least one of the fibers.

5. The method of claim 1, wherein sliding the reticle relative to the chuck along the first direction is performed such that a contact area between the fibers and the reticle is increased.

6. The method of claim 1, wherein sliding the reticle relative to the chuck along the second direction is performed such that a contact area between the fibers and the reticle is decreased.

7. The method of claim 1, further comprising:
detaching the reticle from the fibers after sliding the reticle relative to the chuck along the second direction.

8. The method of claim 1, wherein a height of the fibers after sliding the reticle relative to the chuck along the first direction is in a range from about 0.5 µm to about 0.8 µm.

9. The method of claim 1, wherein a height of the fibers before sliding the reticle relative to the chuck along the first direction is in a range from about 1 µm to about 1.5 µm.

10. A method, comprising:
sliding a wafer holder relative to a wafer along a first direction, such that a plurality of fibers over a top surface of the wafer holder are inclined away from an imaginary line normal to the top surface of the wafer holder by sliding the wafer holder relative to the wafer along the first direction;
moving, using the wafer holder, the wafer to a carrier; and
after moving the wafer to the carrier, sliding the wafer holder relative to the wafer along a second direction opposite to the first direction, such that the fibers are moved back toward the imaginary line by sliding the wafer holder relative to the wafer along the second direction.

11. The method of claim 10, wherein sliding the wafer holder relative to the wafer along the first direction is performed such that the fibers are in contact with the wafer.

12. The method of claim 10, wherein sliding the wafer holder relative to the wafer along the first direction is performed such that an inclined angle of at least one of the fibers is in a range from about 0 degree to about 10 degrees, and the inclined angle is between a bottom surface of the wafer and a connection line connecting a top end and a bottom end of said at least one of the fibers.

13. The method of claim 10, wherein sliding the wafer holder relative to the wafer along the second direction is performed such that an inclined angle of at least one of the fibers is in a range from about 30 degree to about 80 degrees, and the inclined angle is between a bottom surface of the wafer and an imaginary line connecting a top end and a bottom end of said at least one of the fibers.

14. The method of claim 10, wherein sliding the wafer holder relative to the wafer along the first direction is performed such that a contact area between the fibers and the wafer is increased.

15. The method of claim 10, wherein sliding the wafer holder relative to the wafer along the second direction is performed such that a contact area between the fibers and the wafer is decreased.

16. The method of claim 10, further comprising:
detaching the wafer from the fibers after sliding the wafer holder relative to the wafer along the second direction.

17. The method of claim 10, wherein a height of the fibers after sliding the wafer holder relative to the wafer along the first direction is in a range from about 0.5 µm to about 0.8 µm.

18. The method of claim 10, wherein a height of the fibers before sliding the wafer holder relative to the wafer along the first direction is in a range from about 1 µm to about 1.5 µm.

19. An apparatus, comprising:
a workpiece holding device configured to hold a workpiece; and
a plurality of bendable fibers over a top surface of the workpiece holding device and configured to contact the workpiece, wherein the bendable fibers are inclined relative to the top surface of the workpiece holding device at an angle smaller than about 80 degrees and greater than about 30 degrees.

20. The apparatus of claim 19, wherein a width of the bendable fibers is in a range from about 0.2 µm to about 0.5 µm.

* * * * *